United States Patent [19]

Indyk et al.

[11] Patent Number: 4,663,186
[45] Date of Patent: May 5, 1987

[54] SCREENABLE PASTE FOR USE AS A BARRIER LAYER ON A SUBSTRATE DURING MASKLESS CLADDING

[75] Inventors: Richard F. Indyk, Poughkeepsie, N.Y.; Francisco J. Lamelas, Ann Arbor, Mich.; Mark O. Neisser, Wappingers Falls, N.Y.

[73] Assignee: International Business Machines Corporation, Armonk, N.Y.

[21] Appl. No.: 855,263

[22] Filed: Apr. 24, 1986

[51] Int. Cl.⁴ .................. B05D 3/12; B05D 5/12
[52] U.S. Cl. ...................... 427/57; 29/846; 106/316; 156/645; 156/656; 156/904; 204/192.15 427/96; 427/99; 427/259; 427/264; 427/266
[58] Field of Search ............ 156/637, 645, 656, 659.1, 156/904, 89; 427/57, 96, 99, 123, 124, 125, 154, 156, 259, 264, 266; 204/192 R, 192 C; 106/286.1, 313, 316; 29/846, 847

[56] References Cited

U.S. PATENT DOCUMENTS

| | | | |
|---|---|---|---|
| 3,726,002 | 4/1973 | Greenstein et al. | 29/577 |
| 3,957,552 | 5/1976 | Ahn et al. | 156/11 |
| 3,968,193 | 7/1976 | Langston, Jr. et al. | 264/61 |
| 4,221,047 | 9/1980 | Narken et al. | 29/840 |
| 4,442,137 | 4/1984 | Kumar | 427/57 |
| 4,493,856 | 1/1985 | Kumar et al. | 427/57 |
| 4,526,859 | 7/1985 | Christensen et al. | 430/314 |
| 4,582,722 | 4/1986 | Herron et al. | 427/57 |

FOREIGN PATENT DOCUMENTS 50124930  4/1977  Japan .

OTHER PUBLICATIONS

IBM Technical Disclosure Bulletin, vol. 20, No. 5, Oct. 1977, "Electroplating Process for Forming Heavy Gold Plating on Multilayer Ceramic Substrates", by D. Loehndorf, p. 1740.

IBM Technical Disclosure Bulletin, vol. 15, No. 8, Jan. 1973, "Replaceable Engineering Change Pad", by J. G. Simek, pp. 2575-2576.

Primary Examiner—William A. Powell
Attorney, Agent, or Firm—T. Rao Coca

[57] ABSTRACT

Disclosed is a screening paste for covering a selected portion of a metallurgical pattern on a substrate while leaving other metallurgy uncovered. The paste is free of polymers and consists, in one example, of 75-80% of a ceramic particulate (such as alumina), 2-8% amorphous fumed silica and 15-20% of linear alcohol. The linear alcohol serves as a vehicle to deliver the solid particles in the paste. In use, after covering the selected portion of the metallurgical pattern with the paste, the alcohol content therein is expelled by subjecting to vacuum treatment at room temperature or heating to a low temperature below about 275° C. thereby obtaining an inert, dry and crack-free protective coating. Upon evaporation of a new metal layer onto the substrate and removal of the protective coating and new metal layer from everywhere except the uncovered metallurgy, the metallurgical pattern is selectively coated with the new metal.

20 Claims, 4 Drawing Figures

SCREENABLE PASTE FOR USE AS A BARRIER LAYER ON A SUBSTRATE DURING MASKLESS CLADDING

The invention relates to integrated circuit packaging and more particularly to a screenable paste material for masking selected portions of a metallurgical pattern on a supporting substrate during maskless cladding of the other portions of the metallurgical pattern.

BACKGROUND OF THE INVENTION

The multilayer ceramic (MLC) technology for fabricating dielectric substrate carriers for semiconductor integrated circuit package assemblies is well-known. The MLC substrate is fabricated by laminating as many as 32 layers of metallized ceramic sheet (formed from alumina mixed with binder material) and sintering the laminate at a high temperature. Each ceramic sheet has a metallic (typically, molybdenum) pattern printed on it, and holes are punched into the sheet to permit metal interconnections (vias) between printed-circuit layers. The sintered substrate is employed for mounting active devices, such as semiconductor chips. In large scale integrated circuit packages, it is known to provide a MLC substrate with engineering change (EC) pads in addition to the controlled collapse chip connection (C-4) pads to be solder bonded to the semiconductor chips. This concept is described in more detail in U.S. Pat. Nos. 3,726,002, 3,968,193 and 4,221,047 assigned to IBM Corporation, the present assignees and in the IBM Technical Disclosure Bulletin, Vol. 15, No. 8, Jan. 1973, p. 2575. In use, discrete wires are ultrasonically bonded to the EC pads which provide additional or alternate wiring capable of connecting the various C-4 pads of the chips mounted on the substrate.

The chip mounting is generally accomplished using a "flip-chip" orientation whereby the chips are mounted to the C-4 pads on the substrate surface using a solder (typically, lead-tin) reflow process. In order to achieve a good bond for the lead-tin solder, the chip mounting C-4 pad is frequently prepared with a very thin coat of gold on a thin coat of nickel deposited over the molybdenum via metallurgy. U.S. Pat. No. 4,493,856 to Kumar et al and assigned to the present assignee (which is hereby incorporated by reference herein), discloses a dual-material metallization process applied to both the C-4 and EC pads. As discussed therein, nickel has excellent adhesion to molybdenum and the subsequent thin flash layer of gold prevents oxidation of the nickel. In addition, the very thin coating of gold on the C-4 pads allows for a good solder bond for chip mounting. A heavy concentration of gold on the C-4 pads, however, leads to solder wettability problems which result in reliability fails upon thermal cycling. The nickel and goldtreated EC pads, on the other hand, require additional heavy plating with gold to allow for frequent and repeated changes in the wire bonding to the pads thereby accommodating testing, engineering changes and defect compensation.

An electroplating method method for forming heavy gold plating on MLC substrates is described in IBM Technical Disclosure Bulletin, Vol. 20, No. 5, October 1977, p. 1740. Applying heavy gold on these pads by a plating process has a history of problems. At times, the heavy gold blisters, at other times, adhesion of gold is poor. U.S. Pat. No. 4,526,859 to Christensen et al and assigned to the present assignee (which is hereby incorporated by reference herein) discloses use of photoresists as masking layers in obtaining a heavy coating of a metal (gold) on either the EC or C-4 pads. The use of resists as mask material is well known, see for example, U.S. Pat. No. 3,957,552 to Ahn et al and Japanese application No. 50-124930, Apr. 19, 1977. As in Christensen, et al, these references disclose the application of a resist, selective exposure of the resist using an appropriate mask and development of the exposed resist forming a pattern and revealing the underlying surface intended to be metallized. Metallization of the entire surface follows whereby the metal layer is deposited on the unexposed resist and on the patterned underlying surface. Removal by float-away or etching techniques of the remaining resist with the overlying metal results in a metallization pattern on the surface.

Similarly, metal masks can be used by placing them in registration with the substrate and, essentially, screening through the mask. However, it is difficult to achieve registration of a pre-formed metal mask with an MLC substrate which has undergone uneven shrinkage during sintering.

Another known method of selectively depositing a metal coating on a pre-existing conductive pads (EC or C-4) requiring no masking step is the maskless cladding process described in U.S. Pat. No. 4,442,137 to Kumar and assigned to the present assignee. In this method, a blanket metal coating is deposited by sputtering, vapor deposition of other known process and subsequently heated to a temperature sufficient to cause the overlying, e.g., gold, coat to diffuse with the underlying metallurgy. At the same time as the metal-to-metal diffusion is occurring, stresses occur which are sufficient to cause the metal deposited on the substrate to flake or spall and consequently be readily removable in a follow-up mechanical cleaning step, such as ultrasonic removal of the residue. However, the deposition and diffusion is nonselective and therefore causes the heavy overlying metal to diffuse and adhere to all of the metal interconnection pads. EC and C-4 alike. As noted above, it is desirable to have a thick gold coating on the EC pads, but not on the C-4 pads.

By far the most promising of all known prior art process for depositing metal onto a selected portion of a metallurgical pattern is disclosed in U.S. Pat. No. 4,582,722 to Herron et al and assigned to the present assignee (which is hereby incorporated by reference herein). In this process (known as the cladding process) a barrier layer is utilized to isolate the areas of underlying metallurgy on which additional metal coating is not desired. The barrier layer disclosed therein is comprised of a ceramic particulate paste having a polymer binder and a low vapor pressure solvent. The barrier layer is allowed to dry to expel the solvent and is baked in a reducing atmosphere to expel the polymer binder. The remaining inorganic layer, having no organic or carbonaceous residues, has sufficient strength to withstand the subsequent maskless cladding processing steps of metal deposition, diffusion and patterning to remove the metal from the non-metallic substrate areas. During the "patterning", such as by ultrasonic means, the barrier layer is also removed leaving a selectively metallized surface.

Although the method of Herron et al, supra has proven to be a highly reliable cladding process, it nevertheless suffers from the disadvantage of requiring a polymeric material to "glue" or hold together the particles constituting the paste. Removal of the paste after screening and drying necessitates subjecting to a high temperature in the range of about 350°–450° C. Such high temperature treatment may result in a high surface concentration of nickel, depending on the thickness of the overlying layer of gold, in the nickel-treated EC pads thereby deleteriously affecting the reliability of the EC pad. From a health and environmental standpoint, due to the generally volatile nature of the polymeric material used in the paste, the handling of such a paste, even in a highly ventilated manufacturing set up, is unpleasant. Also, removal of any nondecomposed polymer (for example, amyl acetate) used in the paste may require a vigorous solvent (such as trichloroethane or xylene) further aggravating the situation. Particularly from the standpoint of cleanability of nondecomposed polymeric material in the paste, since ultrasonic methods are generally employed for cleaning in a large volume manufacturing environment, in order to safeguard against health and explosion hazards associated with the solvents used for cleaning, construction of a complicated ultrasonic cleaning tank system will be necessitated. Such a system adds to the manufacturing cost of the product.

Another basic shortcoming of the prior art polymer-based paste for cladding process is that, due to its fundamental requirement that the substrate be subjected to a high temperature to decompose the binder material in the paste, it cannot be used in conjunction with a substrate which itself is composed or has a coating thereon of a thermally degradable material. One such situation is the fabrication of advanced chip packaging known as thin film redistribution (TFR), wherein one or more layers of metallization and insulating material are deposited onto a MLC substrate, each layer being patterned with a photolithographic process. The metallization layers themselves can consist of several different metals sputtered in succession. In the TFR, it is desirable that the EC pad metallization have an additional sputtered layer of metal that the C-4's do not have. One way of putting down an extra layer of metal exclusively on the EC pads is by using a time-consuming and expensive new photolithography cycle of deposition, exposure, development, sputtering, and removal. A more expedient way of selectively metallizing the EC's in a TFR context is by selectively applying a paste suitable as a masking material on the EC pads. In this context, the prior art polymer-based paste would be unsuitable as a masking material since the high temperature thermal step to decompose the polymeric content of the paste would also tend to decompose the photosensitive polymer layers formed on the substrate thereby destroying the TFR structure. Even if the photosensitive polymer layer is not destroyed at this high temperature, interdiffusion of the layers of the metallurgy which ruins the functionality of one or more metallization layers cannot be avoided.

Accordingly, it is an object of the invention to provide a screening paste which does not necessitate a high temperature heating prior to its removal.

It is another object of the invention to provide a screening paste which is free of polymeric material.

It is yet another object of the invention to provide a barrier layer of material for selective masking of a metallization which is conducive to easy removability and cleanability.

It is still another object of the invention to provide a barrier layer of material for covering a selected portion of a metallization on a supporting substrate which is either itself composed of an organic polymeric material or contains one or more layers of such material.

SUMMARY OF THE INVENTION

The above objects and other related objects and advantages may be achieved through the use of novel screening paste herein disclosed for covering a selected area of a metal on a supporting substrate during maskless cladding. The paste in its broadest form is composed of an inert fill material of a desired particle size, a nonpolymeric solvent and an inorganic thickening or rheology-control agent. In one preferred embodiment of this invention, the inert fill is solid ceramic particulate, the solvent is linear alcohol and the thickening agent is amorphous fumed silica. Preferably, the ceramic particulate is alumina and the linear alcohol is a mixture of n-dodecanol and n-tetradeconol. In a specific example of the composition of the screening paste is about 75–80% by weight of alumina, about 15–25% of linear alcohol consisting of a mixture of 85% n-dodecanol and 15% n-tetradecanol and about 2–8% of fumed silica particles. The formulation of the paste may be effected by mixing the ingredients using conventional methods.

In use, the inorganic paste is screened onto selected portions of a metallized substrate to serve as a barrier layer thereover while leaving the other portions of the metallurgy uncovered. The alcoholic solvent in the barrier layer is evaporated by subjecting the substrate to a vacuum treatment at room temperature or heating the substrate to a low temperature below about 275° C. The resulting coating of alumina and silica particles which is crack- and residue-free has sufficient strength to withstand subsequent maskless cladding process of blanket metal deposition and "patterning". During "patterning", accomplished typically by ultrasonic agitation, the unwanted metal and the coating are removed leaving a clean, selectively metallized surface.

BRIEF DESCRIPTION OF THE DRAWINGS

The novel features characteristic of the invention are set forth in the appended claims. The invention itself, however, is best understood by reference to the detailed description which follows in conjunction with the accompanying drawings, wherein:

DETAILED DESCRIPTION OF PREFERRED EMBODIMENT

Figure 1A:
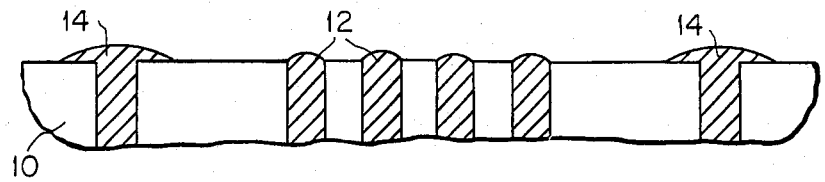
FIGS. 1A–1D illustrate in cross-sectional representation the processing steps associated with the use of the novel screening paste in according with the invention.

The novel screening paste in accordance with the invention is constituted basically of three materials: an organic nonpolymeric and inert fill material of a predetermined particle size; an inorganic thickening agent; and an organic nonpolymeric vehicle or solvent to deliver the aforementioned ingredients in the form of a paste. Since the paste is free of any organic polymeric binding agent holding together the solid particles of the paste, removal thereof after use does not necessitate polymer decomposition by high temperature. This unique combination of ingredients provides the thermal and mechanical characteristics desired of a screening paste for a cladding process.

The inorganic fill material can be any solid particulate which has the characteristics of inertness and extreme thermal stability. An example of the inorganic fill material is alumina ($Al_2O_3$) in powdered form. The preferred alumina particle size is less than about 0.5 μm. A commercially available superground alumina having this particle size is XA-139 sold by Aluminum Corporation of America. If alumina in this superground form is not available, then, starting from a somewhat larger particle size alumina and subjecting it to ball milling in a suitable vehicle, such as, methanol followed by drying to evaporate the methanol, the preferred particle size may be obtained. Ball milling would have the additional advantage of breaking up any alumina agglomorates which may otherwise render the final paste of a rather uneven consistency. A commercially available alumina having this larger crystalline size is Alcan Aluminum Corporation grade C-75.

The thickening agent in the screening paste is preferably amorphous fumed silica. Fumed silica is a ceramic material like the alumina fill, and has a very fine particle size. The fumed silica is used to control the thixotropy of the paste, i.e., how quickly the paste gels up upon application. The desired thixotropy is governed by the particular intended use of the paste, viz. the fineness of the metallization lines that are desired to be masked by the paste and the thickness of the paste layer necessary for such masking purpose. A commercially available fumed silica is Cabosil M-5 sold by Cabot Corporation.

The organic solvent constituting the screening paste is preferably a linear alcohol. This organic material serves as a vehicle to deliver the solid alumina particles and fumed silica to the substrate surface. A linear alcohol is selected because of its low vapor pressure at room temperature, low molecular weight, low toxicity, and ability to easily evaporate under vacuum or with warming. One example of a linear alcohol is n-decanol. Another example is a mixture of the linear alcohols n-dodecanol and n-tetradecanol. A commercially available linear alcohol, which is a mixture these two specific alcohols, is Epal 12/85 sold by Ethyl Corporation. Epal 12/85 consists of 85% n-dodecanol and 15% n-tetradecanol.

The specific proportion of the fill material, the thickening agent and the vehicle is determined by the particular intended use of the paste. The screening paste should have a sufficient amount of solids content and thickening agent so that upon application on a surface it remains stable and gels up thereby making good pattern definition possible. In other words, the fluid content therein should not be such as to permit the paste to ooze out and cover unintended areas. For example, for screening the paste as a cladding on MLC metallization lines having a line spacing of about 5–10 mils the following proportions (weight percent) would be suitable:

| | |
|---|---|
| alumina | 75–80% |
| linear alcohol | 15–20% |
| fumed silica | 2–8% |

Formulation of the paste may be accomplished by hand-mixing the ingredients and then exposing the resulting mixture to an ultrasonic horn. Alternatively, the mixing may be accomplished with the aid of a mechanical mixer or an ultrasonic paste-mixing tool. Yet another method of formulating the paste, particularly when fine particle size alumina is unavailable, is by ball milling. The alumina is ball milled in methanol to break up sintered alumina agglomorates. The methanol is driven off. Next, the deagglomerated alumina and linear alcohol are mulled into a mixture followed by ball milling the mulled mixture. Finally, the contents of the ball-mill are transferred to a mechanical mixer and mixed with the fumed silica into a consistent and screenable paste.

EXAMPLE

To prepare a screening paste for cladding the C-4 pads of a MLC substrate during heavy layer of gold deposition on EC pads the following percentages by volume of the three basic ingredients were selected:

| | |
|---|---|
| Premilled alumina (Alcan C-75) | 75.2% |
| Fumed silica (Cabosil M-5) (particle size 0.014 μm) | 5.0% |
| Linear alcohol (Epal 12/85) | 19.8% |

Premilling of alumina was accomplished by weighing out the as-received alumina, which contained rather large particle size of about 3 μm and fairly large (50–100 μm) agglomerates, and methanol. These two ingredients were mulled for about five minutes at a medium speed to disperse the alumina. The mulled mixture was then transferred to a ball mill to break up the agglomorates down to a size of less than about 10 μm as measured by a grind gage. The premilling was completed by drying to drive off the methanol.

Following the drying step, the milled alumina and the linear alcohol were milled in a ball-mill fitted with zirconia balls at a high shear rate to disperse the alumina. Zirconia balls were utilized for obtaining a high milling efficiency. Following the dispersion of the alumina, to thicken up the paste the contents of the ball mill were transferred to a mechanical mixer. Fumed silica was then added to the mixer and dispersed into the viscous mixture obtained a thick screening paste.

Figure 1B:
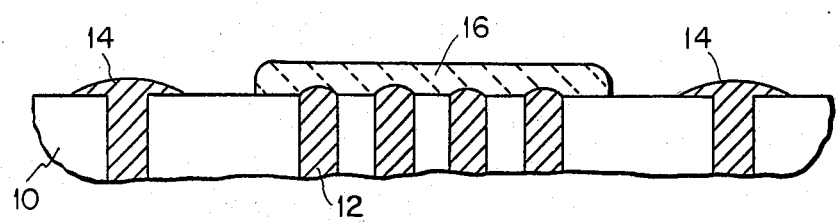
Figure 1C:
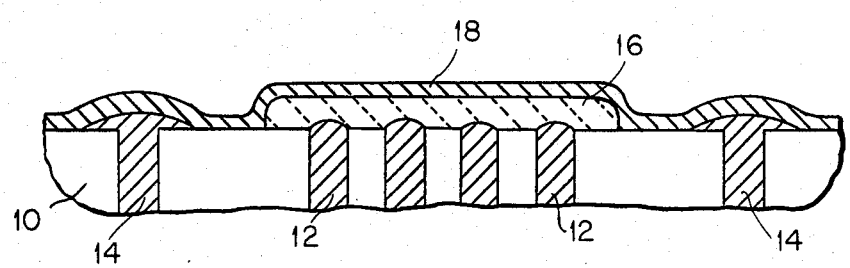
Figure 1D:
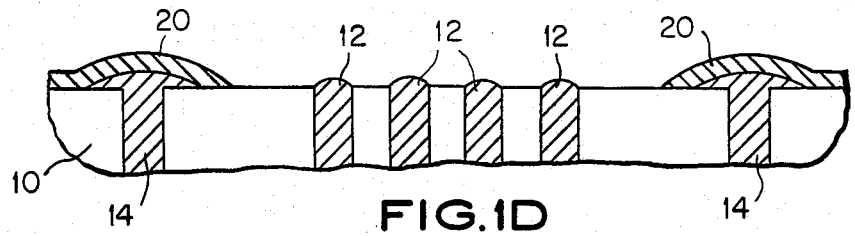

The method of using the novel screening paste described hereinabove will now be described with reference to the maskless gold cladding process in which EC pads on a MLC substrate are required to be covered with a thick layer of gold while ensuring that such a gold layer is not formed on the C-4 pads. Referring to FIGS. 1A–1D, 10 designates a metallized MLC substrate containing a pattern of C-4 pads 12 for mounting an integrated circuit chip and EC pads 14 associated with the substrate. To coat the EC pads 14 alone with a heavy layer of gold without concurrently coating the substrate 10 or the C-4 pads 12, the nonpolymeric paste in accordance with the invention is screened through an open mask in the form of a barrier layer 16 onto the C-4 areas 12 of the substrate as illustrated in FIG. 1B. Following the screening step, the substrate is subjected to a baking process at a low temperature below about 275° C. for about 10–20 minutes to expel the linear alcohol from the barrier layer. To accelerate the drying process or reduce the drying temperature, drying may be accomplished under vacuum conditions. The particular temperature to which the barrier layer be subjected to evaporate the solvent therein is quite flexible. Since the alcohol in the paste is easily evaporable, it can be expelled even at room temperature by subjecting the barrier layer to a high vacuum. To lower the evaporation temperature, a lower molecular weight linear alcohol could be used as the paste solvent. The barrier layer that remains after expelling the alcohol vehicle therein will be clean, dry and crack-free and has a strength sufficient to withstand the subsequent maskless cladding process steps, for example, the temperatures experienced during gold sputtering. Next, as illustrated in FIG. 1C, a heavy layer of gold 18 is then sputtered onto the substrate. Finally, by subjecting the structure to ultrasonic agitation or by brush cleaning the gold layer 18 formed everywhere except on the EC pads 14 is removed. During this last step, the dry protective layer 16 is also removed leaving a surface where only the EC pads are coated with a thick gold layer 20 as shown in FIG. 1D.

Since the barrier layer is perfectly dry prior to metal sputtering, contamination of the metal layer due to outgassing which is characteristic of the prior art polymer based pastes is avoided. Since the screening paste does not require a high temperature treatment to volatilize the solvent therein, it is conducive for use with substrate structures which cannot withstand the high temperature treatments required of the polymer-based pastes during maskless conductive cladding thereof. From a health and environmental standpoint, the alcohol-based paste lends itself to easy removal during cleaning with relatively innocuous isopropyl alcohol.

Thus, there has been provided in accordance with the invention, a novel screening paste which satisfies the objects and advantages set forth above.

While the invention has been set forth in conjunction with specific preferred embodiments, it is evident that many alternatives, modifications and variations will be apparent to those skilled in the art in light of the foregoing description. It is, therefore, contemplated that the appended claims will embrace any such alternatives, modifications and variations as fall within the true scope and spirit of the invention.

We claim:

1. A screening paste for covering a selected area of a metallization on a substrate during maskless cladding, said paste having a composition comprising:
   an inert and inorganic fill material;
   an inorganic thickening agent; and
   a nonpolymeric vehicle.

2. The paste as in claim 1 wherein said vehicle is linear alcohol.

3. The paste as in claim 1 wherein said fill material is a ceramic particulate.

4. The paste as in claim 1 wherein said thickening agent is amorphous silica.

5. The paste as in claims 3 wherein said ceramic particulate is alumina.

6. A paste material for protecting selected metal areas of a plurality of spaced metal areas on the surface of a substance during maskless cladding having a composition comprising:
   ceramic particles;
   fumed silica; and
   linear alcohol.

7. The paste material as in claim 6 wherein said ceramic particles comprise alumina.

8. The paste material as in claim 6 wherein said composition is about 75–80% of alumina, 2–8% of fumed silica and 15–20 percent of linear alcohol.

9. The paste material as in claim 6 wherein said linear alcohol is a mixture of n-dodecanol and n-tetradecanol.

10. The paste material as in claim 9 wherein n-dodecanol constitutes 85% of said linear alcohol.

11. A barrier layer for covering selected metallurgical areas on a substrate during the application of a subsequent metallurgy, said layer having a composition comprising:
    ceramic particles and amorphous fumed silica in linear alcohol.

12. The barrier layer as in claim 11 wherein said ceramic particles comprise alumina.

13. The barrier layer as in claim 12 wherein said alumina is composed of particles of size less than about 0.5 μm.

14. The barrier layer as in claim 13 wherein said linear alcohol is a mixture of 85% n-dodecanol and 15% n-tetradecanol.

15. A process for coating a conductive material selectively on at least one of plurality of spaced metal areas on a substrate, comprising:
    preparing a paste of ceramic particles, fumed silica and linear alcohol;
    coating a selected number of said metal areas with the paste;
    expelling said alcohol in said coating by subjecting to a vacuum conditions at a low temperature;
    blanket coating the surface of the substrate with a film of a conductive material, including coating the unprotected said metal areas; and
    removing said conductive material film from the non-metal areas of said substrate, while concurrently removing said paste coating and overlying conductive material film from said selected metal areas.

16. The process as claim 15 further comprising subjecting said paste coating to a temperature below about 275° C. to expel said alcohol.

17. The process as in claim 16 wherein said substrate is composed of polymeric material.

18. The process as in claim 17 wherein said substrate is an alumina ceramic.

19. The process as in claim 18 wherein said conductive material is gold.

20. The process as in claim 19 wherein said removing step is accomplished using ultrasonic horn exposure.

* * * * *